United States Patent [19]

Jarvis

[11] Patent Number: 5,200,601
[45] Date of Patent: Apr. 6, 1993

[54] FLEXIBLE IDENTIFICATION CARD OR TOKEN

[75] Inventor: Charles R. Jarvis, Bewdley, Great Britain

[73] Assignee: W. & T. Avery Limited, West Midlands, United Kingdom

[21] Appl. No.: 603,710

[22] PCT Filed: Jan. 18, 1990

[86] PCT No.: PCT/GB90/00081
§ 371 Date: Nov. 19, 1990
§ 102(e) Date: Nov. 19, 1990

[87] PCT Pub. No.: WO90/08365
PCT Pub. Date: Jul. 26, 1990

[30] Foreign Application Priority Data

Jan. 19, 1989 [GB] United Kingdom ............... 8901189

[51] Int. Cl.$^5$ .................. G06K 19/077; G06K 19/07
[52] U.S. Cl. .............................. 235/492; 235/487; 235/488
[58] Field of Search ................ 235/487, 492, 488

[56] References Cited

U.S. PATENT DOCUMENTS

| | | | |
|---|---|---|---|
| 4,463,971 | 8/1984 | Hoppe et al. | 235/487 |
| 4,649,418 | 3/1987 | Uden | 235/487 |
| 4,725,924 | 2/1988 | Juan | 235/492 |
| 4,754,544 | 7/1988 | Hanak | 437/2 |
| 4,755,661 | 7/1988 | Ruebsam | 235/488 |
| 4,841,134 | 6/1989 | Hida et al. | 235/492 |
| 4,849,803 | 7/1989 | Yamamoto et al. | 357/72 |
| 4,897,534 | 1/1990 | Haghiri-Tehrani | 235/492 |
| 4,962,415 | 10/1990 | Yamamoto et al. | 235/487 |

FOREIGN PATENT DOCUMENTS

| | | |
|---|---|---|
| 0231937 | 8/1987 | European Pat. Off. . |
| 0321340 | 6/1989 | European Pat. Off. ............ 235/488 |
| 45977 | 9/1986 | Japan . |
| 61-214086 | 9/1986 | Japan . |

OTHER PUBLICATIONS

IBM Technical Disclosure Bulletin, vol. 28, No. II, Apr. 1986, pp. 4723–4725, "IBM Smart Credit Card".
McGraw-Hill Concise Encyclopedia of Science & Technology Second Edition, 1989, p. 1445.

Primary Examiner—Eugene R. LaRoche
Assistant Examiner—Christopher R. Glembocki
Attorney, Agent, or Firm—Spencer, Frank & Schneider

[57] ABSTRACT

A portable electronic card or token has a plurality of discrete electronic components mounted on a flexible substrate, the substrate and the components are encapsulated in a plastics material, and at least one respective high tensile member is associated with each component and disposed such that a region of the card or token encompassing the component is restrained from flexing. The flexing substrate forms resilient hinge portions between adjacent components.

8 Claims, 1 Drawing Sheet

FLEXIBLE IDENTIFICATION CARD OR TOKEN

BACKGROUND OF THE INVENTION

1. Field of the Invention

This invention relates to a portable electronic token and in particular it relates to a portable token of credit card sized dimensions and containing electronic circuits for data storage and processing. Such a token is commonly termed a "Smart Card" or "integrated circuit card". The term "token" as used herein is to be understood to include "card".

2. Background Information

A Smart Card generally comprises one or more components such as integrated circuits mounted on a substrate and encapsulated within a plastics material or laminate of credit card sized dimensions, typically 8.5×5.4×0.075 cms. It is important that such cards are flexible so that they can be placed in the user's pocket, wallet or purse and be capable of withstanding bending forces. Furthermore, for the card to be compatible with present day systems it must include a magnetic strip and meet with the flexing requirements imposed upon cards to be used in cash dispensing machines, which are governed by ISO standards.

It has been previously proposed to provide a contact-type smart card structure which protects the components, either by mounting them on a metal foil and encapsulating them in a hard resin as described in EP0068539A, or by providing a box-like structure of a plastics material within the token which encloses the components as described in U.S. Pat. No. 4,755,661.

The present invention seeks to provide an alternative structure which is particularly applicable to contactless smart cards.

SUMMARY OF THE INVENTION

According to the present invention there is provided a portable electronic token comprising a plurality of discrete components encapsulated in a plastics material and at least one respective high tensile member associated with each component and disposed such that a region of the token encompassing the component is substantially constrained from flexing, the components being mounted on a flexible substrate which extends between the components so as to form resilient hinge portions between adjacent components.

In a preferred embodiment, the token comprises a pair of face members defining opposite surfaces of the token and the flexible substrate is disposed between said members. The token is typically a "contactless" Smart Card, that is information is passed to and from the card by inductive coupling such that no direct electrical contact is needed between the components and the surface members.

The face members of, for example, polycarbonate act as strengthening skins and may also act as labels for the token.

In one preferred embodiment two high tensile members are provided which are associated with each component, in which case one may be provided above the component and a complementary one below the component, where above and below are terms denoting the relative position of the member with respect to the substrate. The second member may be integral with the substrate or may be an extra component.

The high tensile members are advantageously made of a metal foil such as nickel, stainless steel or high tensile steel.

In the embodiments described above, the reinforcing effect of the high tensile members can be supplemented by providing a hard resin around the component.

BRIEF DESCRIPTION OF DRAWINGS

The present invention will now be described, by way of example with reference to the accompanying drawing, in which the single FIGURE shows a diagrammatic side view of an embodiment of the present invention.

DETAILED DESCRIPTION OF THE PREFERRED EMBODIMENTS

Figure 1:
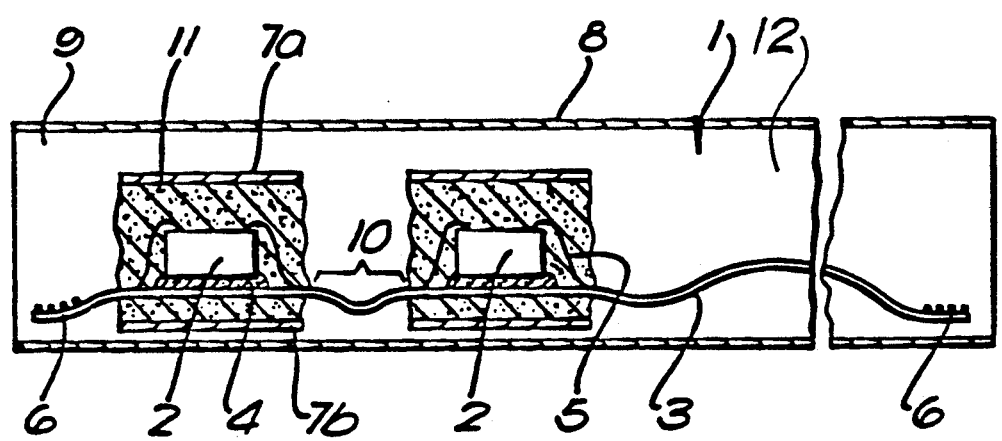

Referring now to the drawing, FIG. 1 shows a portable token 1 of credit card sized dimensions. The card comprises a plurality of electronic components 2 such as integrated circuits. The circuits will generally include microprocessing and memory functions and are mounted upon a flexible substrate 3 which may be a polyimide or polyester. The components 2 are mounted upon the substrate by a bonding material 4 and connected by further bonds 5 to electronic interconnections on the substrate (not shown). The card shown is one of the contactless coupling type and includes an inductive loop 6 mounted towards its periphery, for receiving power and transmitting and receiving data signals.

Complementary pairs of foils 7a and 7b are provided above and below components 2. The foil 7b may be in contact with a surface of the substrate 3 remote from the components 2. These foils are made of a material such as nickel or stainless steel but can be of any material provided it has good tensile properties. The region between the foils is filled with a hard glob top resin material 11 such as an epoxy resin or a silicon resin which reduces shear between the foils, is ionically clean and thermally conductive. One or more labels 8 may be provided on the surfaces of the card. The labels may be of polycarbonate and can be skins which, together with the plastics material 12 between them serve to produce a strong but flexible card. The card is manufactured either by a lamination process as is well known in the art or by means of an injection moulding process in whcih a suitable fluid plastics material is applied to a mould which already contains the components, substrate and labels and then allowed to harden.

It is thus seen that the structure of the card around each component and, if the labels are of suitable material, of the card as a whole is equivalent to that of a double skinned hull commonly used in boat building and in aircraft structures. The combination of the foils 7a and 7b and resin material between them act to stiffen and strengthen the card around the region of each component and thus prevent this region from flexing, which could be potentially disastrous to the circuits or electrical connections. Flexing is however allowed of those portions of the card not surrounding the components, such as the region 10 in the FIGURE. The portion of the substrate 3 in this region accordingly acts as a hinge when the card flexes. Thus a card embodying the invention can be manufactured, which card is flexible enough to withstand the bending when carried by a user, or in operation, but protects, and holds rigid the region surrounding, each component.

The construction described herein is particularly useful for contactless smart cards as no contacts are required with the surface layer. Consequently, the substrate/component layer can be manufactured with the reinforcement in place as the position of the substrate between the skins 8 is not critical as it is in a contact-type card where surface contacts are required.

The card as a whole is likely to be subject to considerable deformation in use. The combination of the labels on opposing faces serves to preserve the integrity of the structure and significantly reduces the likelihood of the reinforced regions around the or each component 'breaking out' of the structure.

Changes can be made while remaining within the scope of the invention.

I claim:

1. A portable electronic token having an overall predetermined minimum flexibility and formed of a flexible plastics material, said token including:

an electronic component mounted on a flexible substrate providing electrical connections to said component, said electronic component and said electrical connections defining a region of said token;

a first high tensile member overlying and encompassing said region; and a second high tensile member underlying and encompassing said region, said first and second high tensile members, said electronic component and said flexible substrate being encapsulated by said flexible plastics material, wherein said first and second high tensile members serve to restrain said token from flexing over said region of token, portions of said token including said plastics material and said substrate which are peripheral to said region, providing increased flexibility to thereby maintain the overall predetermined minimum flexibility of said token.

2. A token as claimed in claim 1 further comprising a pair of face members defining opposite surfaces of said token, the flexible substrate being disposed therebetween.

3. A token as claimed in claim 2 wherein said face members are formed of a material selected from polycarbonate and polyester.

4. A token as claimed in 1 wherein said first and second high tensile members are metal foils.

5. A token as claimed in claim 4 wherein said metal foils are composed of a metal selected from the group comprising nickel, stainless steel and high tensile steel.

6. A token as claimed in claim 1 wherein the electronic component comprises processing means for processing data, the processing means being operatively connected by said flexible substrate to memory means for storing data, and to inductive input/output means, for contactlessly interacting with an external read/write unit to transmit and receive data.

7. A token according to claim 1 wherein there are a plurality of said electronic components each mounted on said flexible substrate and electrically connected thereto, each said component defining a respective region and having associated therewith a respective pair of said first and second members whereby said token is restrained from flexing in each of said regions and portions of said token between said regions act as hinges so as to provide increased flexibility thereat and said predetermined minimum flexibility to said token.

8. A token according to claim 1, further including a hard glob top resin material encapsulating said electronic component and said electrical connections between said first and second high tensile members, said hard glob top resin being encapsulated with said substrate and said first and second high tensile members by said plastics material to form the token.

* * * * *